Figure 1:
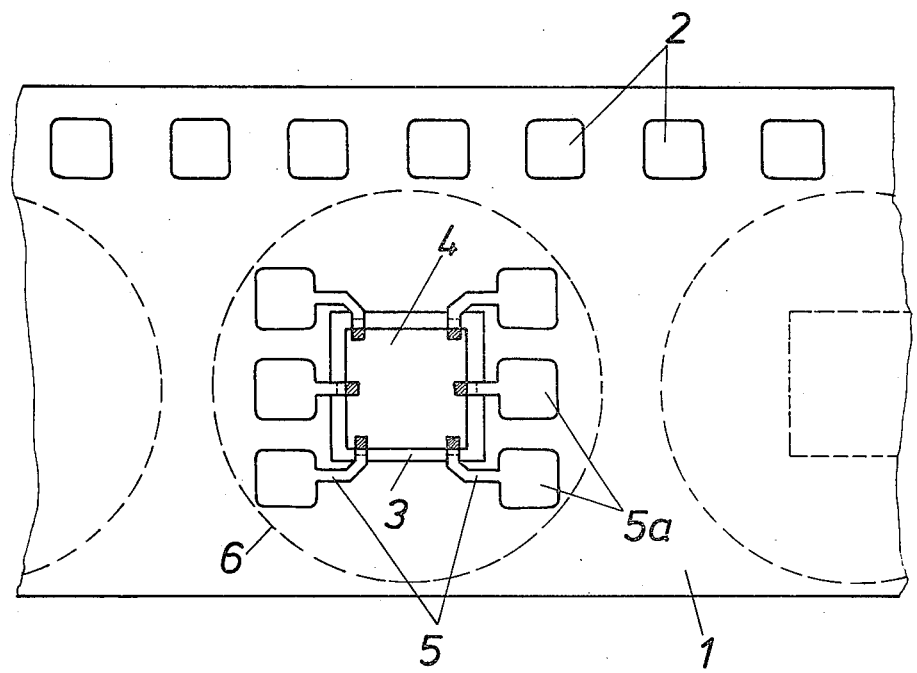

United States Patent [19]

Haghiri-Tehrani et al.

[11] Patent Number: 4,474,292

[45] Date of Patent: Oct. 2, 1984

[54] CARRIER ELEMENT FOR AN IC-CHIP

[75] Inventors: Yahya Haghiri-Tehrani; Joachim Hoppe, both of Munich, Fed. Rep. of Germany

[73] Assignee: GAO Gesellschaft für Automation und Organisation mbH, Fed. Rep. of Germany

[21] Appl. No.: 261,673

[22] Filed: May 7, 1981

[30] Foreign Application Priority Data

May 20, 1980 [DE] Fed. Rep. of Germany ....... 3019207

[51] Int. Cl.³ .................... B65D 73/02; B65D 85/42
[52] U.S. Cl. .................................... 206/329; 206/331; 206/332; 206/334
[58] Field of Search ............... 206/328, 329, 330, 331, 206/332, 334

[56] References Cited

U.S. PATENT DOCUMENTS

| 3,385,426 | 5/1968 | May et al. | 206/329 |
| 3,417,865 | 12/1968 | Suverkropp et al. | 206/329 |
| 3,858,721 | 1/1975 | Boyer et al. | 206/330 |
| 3,994,394 | 11/1976 | McRostie et al. | 206/329 |
| 4,034,854 | 7/1977 | Bevilacqua | 206/329 |

Primary Examiner—Joseph Man-Fu Moy
Attorney, Agent, or Firm—Andrus, Sceales, Starke & Sawall

[57] ABSTRACT

A carrier element suitable for production in large numbers, e.g. for incorporation in identification cards, having an integrated circuit and the connection leads and contacts necessary for the operation of the circuit. The carrier consists of a single or multilayer insulating material, e.g. a film, carrying the circuit contacted with the connection leads in punched out windows. To protect the circuit from mechanical stress the thickness of the film is greater than or at least equal to the thickness of the integrated circuit plus the thickness of the contacted connection leads.

2 Claims, 5 Drawing Figures

CARRIER ELEMENT FOR AN IC-CHIP

SPECIFIC DESCRIPTION

The invention concerns a carrier element for a chip with integrated switches for incorporation in identification cards or similar data carriers, with a carrier made of insulating material having windows at regular intervals in which the chips are arranged and connected with connection leads extending to the middle of the windows, whereby the connection leads are etched out of a conductor foil applied to the carrier.

An identification card with an embedded integrated circuit is described in the German patent application P 29 20 012 of the applicant. To produce the card an intermediate product (carrier element) is used which accepts the semiconductor component with all its contact elements, and which can be produced as a functionally self-contained unit independently of the card manufacture.

The carrier element, which can have a circular, box-shaped construction, is produced by using several films in the cold lamination method (bonding technique).

Identification cards or similar data carriers suited for automatic payment and service systems are being introduced more and more all over the world. Present estimations indicate that in the future this type of card will be used in the millions annually. The identification cards used at present make use of a magnetic strip as a storing or communication medium for automatic operation.

IC identification cards or other data carriers with similar electronic circuits are more advantageous than the above cards due, among other things, to their greater storage capacity and their ability to participate actively in communication processes.

As the carrier element is an important element in the manufacture of the card, an economical method of producing the carrier elements in the numbers to be expected is of great consequence. Furthermore, it must be considered that the steps for protecting the semiconducting crystal against mechanical stress play a great part in the manufacture of carrier elements of the stated type.

The object of the invention thus consists in providing a carrier element that can be incorporated in identification cards or similar data carriers for integrated circuits or similar components, which is particularly rational and thus economical to produce, and furthermore provides the circuit with good protection against mechanical stress.

According to the invention this object is achieved for the carrier elements stated at the outset when the thickness of the carrier is greater than or at least equal to the thickness of the chips plus the thickness of the contacted connection leads. The contacting procedure used for the invention has been known for some time (DE-OS 2500 180). The carrier, e.g. a flexible but non-ductile film, is provided with equally spaced windows for mounting the chips. Self-supporting connection leads of a contact spider etched into a conductive film coating extend to the middle of the windows and are connected with the corresponding connection points of the chip. This method is also advantageous in that all of the connections with the semiconductor chip can be produced simultaneously and thus economically.

The invention makes use of this advantageous method but uses a carrier of which the thickness is greater than or at least equal to the thickness of the semiconductor chip plus the thickness of the contacted connection leads. Thus the production of an intermediate product which is particularly advantageous for incorporation in identification cards or similar data carriers, is possible. The IC carrier elements can be produced rationally and therefore economically especially in large numbers due to a reliable contacting method. Good protection of the semiconducting crystal and its connection lead against mechanical deformation, results from the fact that the silicon chip and its connection points are arranged in a window of a carrier which is thicker than or at least as thick as the silicon chip itself. This protection is guaranteed to the same degree during the storage of the carrier elements, the incorporation of the elements in the identification cards as well as during the handling of the cards.

The carrier provided with the windows can be in the form of a film or else in the form of sheets. After the semiconductor chips are contacted, the actual carrier elements that are suitable for incorporation in identification cards are punched out of the carrier (film, sheet) employed.

In accordance with an advantageous development of the invention it is also possible to fill the windows of the carrier with material that can be moulded in order to improve the protection of the semiconductor chip further, especially during storage and handling of the carrier elements.

The carrier can also have a multilayer construction, whereby the single layers are joined together before or after contacting the semiconductor chip by the known method. Joining a second carrier layer to the first carrier layer after contacting has the advantage that standard film carriers can be used to contact the chips. Further features and advantages of the invention become apparent in the description of the embodiments.

Figure 2:
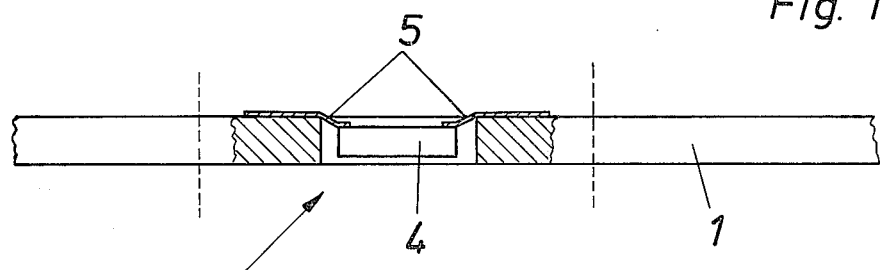
Figure 3:
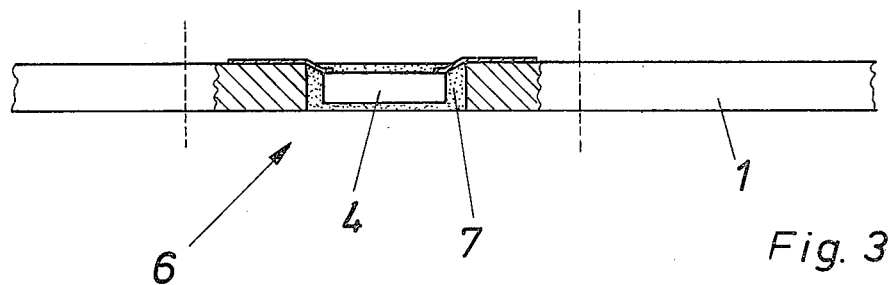
Figure 4:
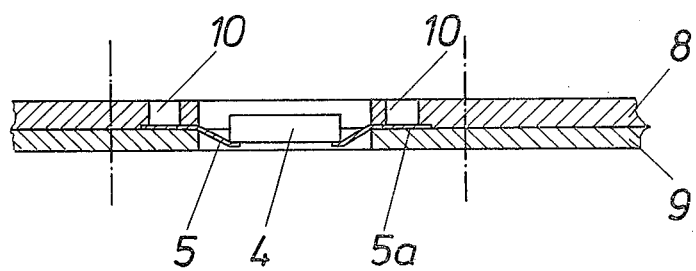
Figure 5:
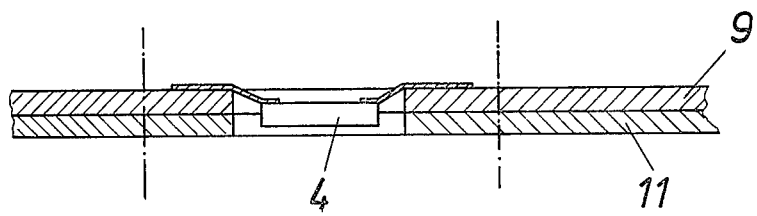

FIG. 1 shows a section of a film with a semiconductor chip incorporated in a window, FIG. 2 shows a section of the arrangement in FIG. 1, FIG. 3 shows a section of the arrangement in FIG. 1, whereby the window is filled with material that can be poured, FIG. 4 shows a multilayer carrier, whereby the connection leads are partly covered, FIG. 5 shows a multilayer carrier, whereby the connection leads are not covered.

In the form of execution of the invention shown in FIG. 1 a film 1 is used as a carrier for the semi-conductor chips, which film is provided with perforations 2 for its operation in contacting automatic equipment. The film 1 is provided with windows 3 at regular intervals to accept the semiconductor chips 4. Self-supporting connection leads 5 formed of a conductive coating laminated onto the film by the known photographic etching methods (see DE-OS 24 14 297), extend to the middle of each window 3. The connection leads which are connected with the appropriate points of the semiconductor chip 4 in suitable contacting automatic equipment, end in relatively large contact surfaces 5a, which serve the purpose of galvanic contact pick-up in corresponding automatic equipment for the operation of the carrier elements incorporated in identification cards.

As can be seen especially in FIG. 2, which shows a section of the form of execution represented in FIG. 1, the film 1 employed is thicker than the semiconductor chip 4 including the thickness of the connection leads 5 on the chip. The actual carrier elements 6 are finally punched out of the film, e.g. as circular discs, as can be seen in the figures in the dotted lines.

FIG. 3 shows a further form of execution of the carrier element according to the invention, in which the window 3 for the semiconductor chip 4 is filled with material than can be poured 7 after contacting the semiconductor chip. This step allows for further improvement of the protection of the semiconductor chip and its connection leads.

FIG. 4 shows a multilayer carrier in which a second layer 8 is applied to the layer 9, e.g. after contacting the semiconductor chip 4, with the connections 5 arranged on the layer 9. Layer 9 is provided with windows 10 which allow for access to the contact surfaces 5a.

FIG. 5 also shows a multilayer carrier, in which, however, a second layer 11 is arranged on the side of layer 9 which is not covered with connection leads.

What we claim is:

1. The combination of a card-like member and a carrier element contained therein, said carrier element being formed of insulating material having a window therein; said carrier element having a chip with integrated circuits positioned in said window, and said carrier element further having connection leads formed out of a conductive film applied to the carrier element, said carrier element having at least a pair of layers of insulating material bonded together with said conductive films selectively applied between said bonded layers, one of said layers having perforations through it by which said connection leads can be accessed, said connection leads extending into the window for connection to the chip, said carrier element having a thickness greater than said chip for protecting said chip against mechanical forces.

2. The combination of claim 1 characterized in that the window with the carrier element is filled with a mass that can be moulded.

* * * * *